United States Patent
Hellums

[11] Patent Number: 6,157,241
[45] Date of Patent: Dec. 5, 2000

[54] FUSE TRIM CIRCUIT THAT DOES NOT PRESTRESS FUSES

[75] Inventor: James R. Hellums, Plano, Tex.

[73] Assignee: Texas Instruments Incorporated, Dallas, Tex.

[21] Appl. No.: 09/337,456

[22] Filed: Jun. 21, 1999

Related U.S. Application Data

[60] Provisional application No. 60/090,748, Jun. 26, 1998.

[51] Int. Cl.⁷ .................................................. H01H 37/76
[52] U.S. Cl. ........................................ 327/525; 327/334
[58] Field of Search ..................................... 327/525, 526, 327/334

[56] References Cited

U.S. PATENT DOCUMENTS

| | | | |
|---|---|---|---|
| 5,353,028 | 10/1994 | De Wit et al. | |
| 5,361,001 | 11/1994 | Stolfa | 327/525 |
| 5,959,445 | 9/1999 | Denham | 327/525 |
| 6,037,799 | 3/2000 | McClure | 327/525 |

*Primary Examiner*—Terry D. Cunningham
*Attorney, Agent, or Firm*—Alan K. Stewart; Wade James Brady, III; Frederick J. Telecky, Jr.

[57] ABSTRACT

A fuse trim circuit includes: a fuse 40; and a logic gate 55 having a first input coupled to the fuse 40 and a second input coupled to a logic code such that the logic code bypasses the fuse 40 to avoid prestressing the fuse 40.

10 Claims, 1 Drawing Sheet

FUSE TRIM CIRCUIT THAT DOES NOT PRESTRESS FUSES

This application claims priority under 35 USC § 119 (e)(1) of provisional application No. 60/090,748 filed Jun. 26, 1998.

FIELD OF THE INVENTION

This invention generally relates to electronic systems and in particular it relates to fuse trim circuits.

BACKGROUND OF THE INVENTION

A prior art fuse trim circuit used in low cost devices is shown in FIG. 1. The prior art circuit of FIG. 1 includes fuse 10, fuse pad 12, $V_{SS}'$ pad 14, $V_{SS}$ pad 16, resistor 18, current source 20, inverters 22 and 24, supply voltage $V_{DD}$, and output node 26. Only one bit is shown in FIG. 1. In FIG. 1, output node 26 may be routed to a voltage reference or possibly a trim DAC (digital-to-analog converter) for an amplifier in order to trim the offset voltage. The output voltage of the cell is approximately zero volts ($V_{SS}$). This is true because the current source 20 is designed to put out a maximum of 1 $\mu$A, which is only 100 $\mu$V drop across the fuse 10. This voltage will be interpreted by the first inverter 22 as a logic "zero" so the output of inverter 22 will be a logic "one" (the voltage will be equal to $V_{DD}$). Then the output of inverter 24 will be a logic "zero", the same as the fuse pad 12 but buffered. In order to change the state of the fuse cell, the resistance of the fuse 10 must be changed. This is accomplished by holding the $V_{SS}'$ pad 14 at zero volts and raising the voltage on the fuse pad 12 to approximately 6 volts by means of external probes. The 6 volts across the poly silicon fuse resistor 10 (approximately 100 ohms) will cause Joule heating ($i^2R$) due to the current flow which will melt the fuse 10. The melting will be severe enough to open circuit the fuse 10. Another way of saying this is that the fuse resistance becomes infinite. With time some fuses may re-grow so that their resistance will become finite but large (greater than 10 M ohms). Even if the fuses regrow, the voltage across them will be $V_{fuse} \geq I_s R_{fuse} \geq 1$ $\mu$A*10 M ohms>10 V which is larger than the supply voltage, therefore the output will be at $V_{DD}$. This then corresponds to a logic "one", and will be buffered by the two inverters as a logic "one" output.

The normal way to determine which fuses to "blow" (blowing a fuse means to force current through it until it melts), is to force the fuse Pad 12 to a voltage less than that necessary to "blow it" but large enough to trip inverter 22. With special design of the inverter trip point, this voltage can be less than two volts. However, the voltage cannot be too low or the logic noise immunity will be a problem for "zero" outputs. Using probes to force the voltage on each fuse pad 12 relative to $V_{SS}'$, different logical codes can be tried until the right value is determined. Then the fuses that must be "blown" to get logic "ones" can be stressed with 6 to 6.5 volts. What has been found in production is that when a fuse is pre-stressed with approximately 2 volts to determine the right code, then 6 to 6.5 volts does not reliably blow the fuse. It requires 12 to 13 volts. When designs were done in 10 volt CMOS processes, this was possible because the maximum allowable voltage was 13.5 volts. With 5 volt CMOS processes, the maximum allowable voltage is 7.5 volts. Therefore, once stressing a fuse, it cannot be blown reliably in the allowed maximum voltage of the process. The fuse can reliably be blown with 13 volts, but this may cause a reliability problem by over stressing other circuits on the chip.

Some prior art circuits accomplish no prestress, but are very complex. These circuits require a special test mode along with special hardware and test code to implement this function. The extra on chip circuits include read/write registers or SRAM memory, muxes, and a complex differential fuse cell.

SUMMARY OF THE INVENTION

Generally, and in one form of the invention, the fuse trim circuit includes: a fuse; and a logic gate having a first input coupled to the fuse and a second input coupled to a logic code such that the logic code bypasses the fuse to avoid prestressing the fuse.

DETAILED DESCRIPTION OF PREFERRED EMBODIMENTS

Figure 1:
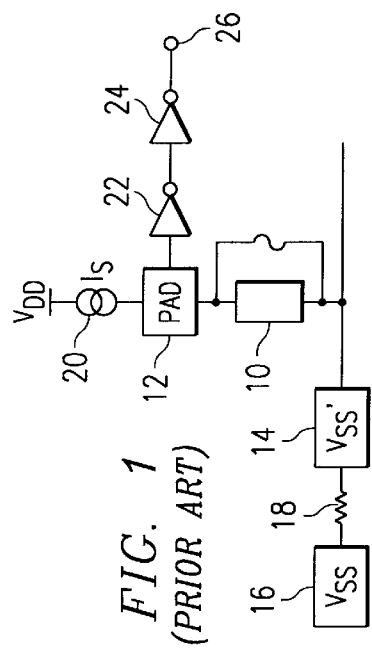
FIG. 1 is a schematic circuit diagram of a prior art fuse trim circuit.
Figure 2:
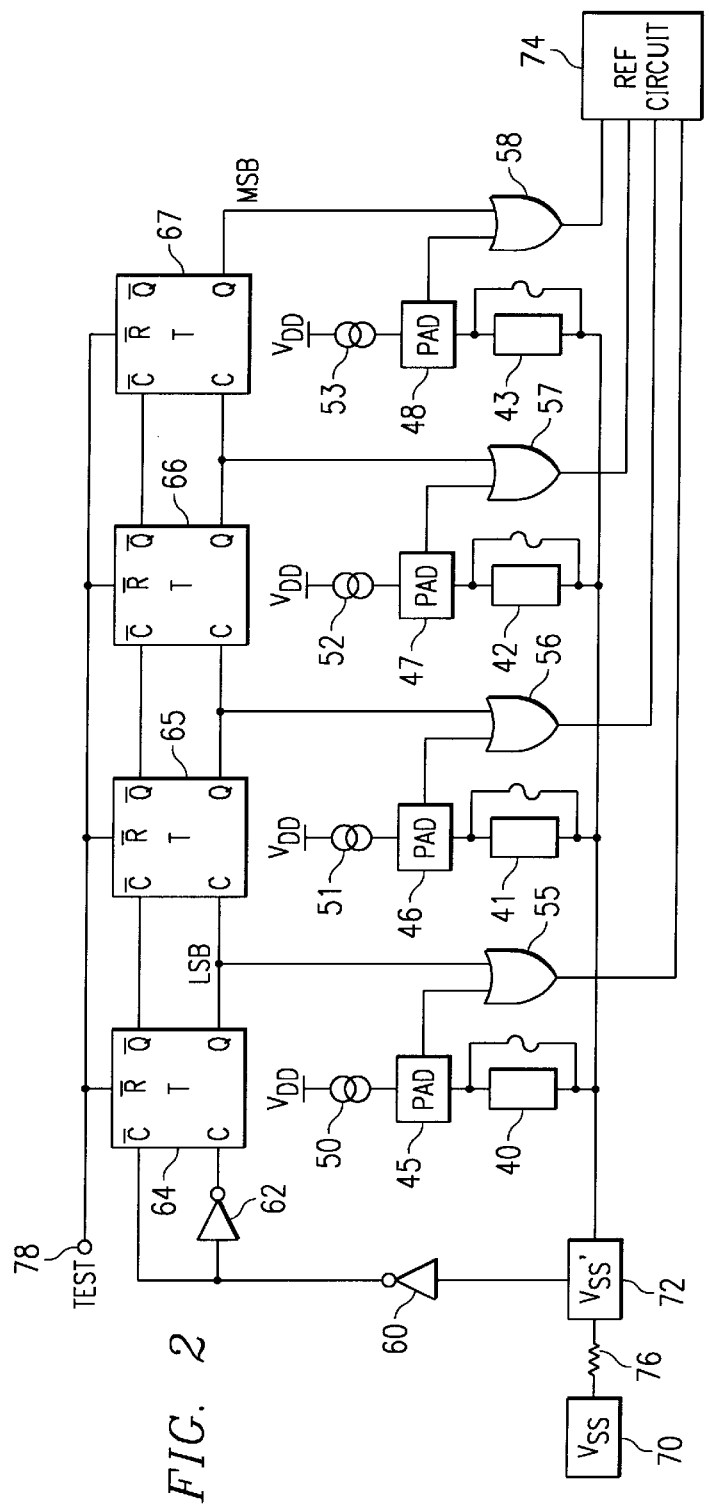
FIG. 2 is a schematic circuit diagram of a preferred embodiment fuse circuit for trimming a reference with four bits.

FIG. 2 is a circuit schematic illustrating a preferred embodiment fuse circuit for trimming a reference with four bits. The circuit of FIG. 2 allows the different logical codes to be tried without any stress on the fuses. This circuit is the simplest circuit that allows all possible states to be examined or measured without flowing current through the fuse before or "blowing". This allows the selected fuses to be blown within the voltage limits.

The circuit of FIG. 2 includes fuses 40–43, fuse pads 45–48, current sources 50–53, OR gates 55–58, inverters 60 and 62, T Flip Flips 64–67, $V_{SS}$ pad 70, $V_{SS}'$ pad 72, reference circuit 74, resistor 76 (approximately 1 K ohm), TEST signal node 78, least significant bit LSB, most significant bit MSB, and supply voltage $V_{DD}$. The T Flip Flops ($T_{FF}$) 64–67 are made from D Flip Flops with the $\overline{Q}$ output connected to the D input. For this circuit, a fully static version is best. The C and $\overline{C}$ inputs of $T_{FF}$s 64–67 are for a clock. The $\overline{R}$ input is a reset of the Q output to logic "zero" when the $\overline{R}$ signal is low (logic "zero"). The OR gates 55–58 are made in CMOS from a NOR gate followed by an inverter. Fuses 40–43 are polysilicon fuses.

In the preferred embodiment shown in FIG. 2, a simple static toggle ripple counter (flip flops 64–67) is used to step through all possible states to be examined or measured. The outputs of the counter are OR'ed with the fuse output by OR gates 55–58. The probe voltage on the $V_{SS}'$ pad 72 controls the counter. Each time the voltage on pad 72 is raised to $V_{DD}$ for some time and then returned to ground (zero volts), the counter decrements by one binary count. When the voltage on pad 72 is changed, the voltage across the fuses 40–43 does not change because current sources 50–53 have high enough compliance that they do not change. Therefore, the voltage drop across each fuse is constant while the counter toggles. In this way, the fuse is not stressed by a large current surge before the time to "blow" the fuse.

The operation of the circuit of FIG. 2 is as follows. Starting with the TEST signal low, the TEST signal is then forced high to go into test mode. All chips today have a test mode, whether it is an input pad on the chip or a logic signal written to a register on the chip. With TEST high, the $T_{FF}$s 64–67 can change state (count). TEST is kept high through this procedure. Then, with a probe on the $V_{SS}'$ pad 72, the voltage on pad 72 is driven from zero volts to $V_{DD}$ and then back to zero volts (ground). (The voltage on pad 72 does not have to go all the way to $V_{DD}$ because inverter 60 has gain.) This causes all of the Q outputs to change from logic "zero" to logic "one". Therefore, the first code at the Q outputs of $T_{FF}$s 64–67 will be "1111" or the binary equivalent to decimal 15. With the $V_{SS}'$ pad 72 at zero volts, all of the fuse PADs 45–48 will be logic "zero", therefore, the OR gates 55–58 will pass the logic value from the Q outputs to the OR gate outputs. "1111" will be the code sent to the REF circuit 74. Measurements are made to determine if this is the code that allows the circuit to work best. If not, the $V_{SS}'$ pad 72 is driven from zero volts to $V_{DD}$, held a short time and then returned to zero volts. This will cause the LSB (least significant bit) to change state from a logic "one" to a logic "zero". The other three bits will not change state. The code will become "1110". Measurements are then made to determine if this is the best code.

Each time the $V_{SS}'$ pad 72 is toggled from low to high and back low again, the binary code changes by a count of binary one. In this way, all the binary codes from "1111" to "0000" can be tried. When the binary code is found that gives the best performance, the fuses corresponding to the bits that must be logic "one" are the fuses that must be blown. The fuse is blown by placing probes between the fuse pad 45, 46, 47, or 48 and the $V_{SS}'$ pad 72 with a voltage difference of approximately six volts. Then the TEST signal goes low for normal mode. The Q outputs of $T_{FF}$s 64–67 become "zero". Then the OR gates 55–58 transfer the logic levels of the fuse pads. If the fuse is blown, a logic one will be passed. If the fuse is not blown, a logic zero is passed.

The preferred embodiment circuit of FIG. 2 provides several advantages. The circuit and procedure described does not require any extra hardware on the test board. It does not require complex circuits on the chip such as read/write storage registers, special test modes or any special protocols to be built into the chip logic or test board logic hardware. It does not require a special fuse cell design on chip, such as a differential fuse circuit. Therefore this method is significantly smaller than the advanced prior art fuse circuits.

Although the present invention has been described in detail, it should be understood that various changes, substitutions and alterations can be made without departing from the spirit and scope of the invention as defined by the appended claims. For example, the described embodiment is a four bit circuit, but this technique can be applied to any number of bits. It is therefore intended that the appended claims encompass any such modifications or embodiments.

What is claimed is:

1. A fuse trim circuit comprising:

a first fuse having a first end coupled to a probe voltage node;

a first logic gate having a first input coupled to a second end of the first fuse;

a first current source coupled to the second end of the first fuse; and a first flip flop having a clock coupled to the probe voltage node, a reset input coupled to a test signal node, and an output coupled to a second input of the first logic gate, wherein the first flip flop is a T-flip flop.

2. The circuit of claim 1 wherein the fuse is a polysilicon fuse.

3. The circuit of claim 1 wherein the logic gate is an OR gate.

4. A fuse trim circuit comprising:

a first fuse having a first end coupled to a probe voltage node;

a first logic rate having a first input coupled to a second end of the first fuse;

a first current source coupled to the second end of the first fuse;

a first flip flop having a clock coupled to the probe voltage node, a reset input coupled to a test signal node, and an output coupled to a second input of the first logic gate, wherein the first flip flop is a T flip flop;

a second fuse having a first end coupled to the probe voltage node;

a second logic gate having a first input coupled to a second end of the second fuse;

a second current source coupled to the second end of the second fuse; and a second flip flop having a clock coupled to the output of the first flip flop, a reset input coupled to the test signal node, and an output coupled to a second input of the second logic gate.

5. The circuit of claim 4 wherein the first and second flip flops are T flip flops.

6. The circuit of claim 4 wherein the first and second logic gates are OR gates.

7. The circuit of claim 4 further comprising:

a third fuse having a first end coupled to the probe voltage node;

a third logic gate having a first input coupled to a second end of the third fuse;

a third current source coupled to the second end of the third fuse; and a third flip flop having a clock coupled to the output of the second flip flop, a reset input coupled to the test signal node, and an output coupled to a second input of the third logic gate.

8. The circuit of claim 7 further comprising:

a fourth fuse having a first end coupled to the probe voltage node;

a fourth logic gate having a first input coupled to a second end of the fourth fuse; and a fourth current source coupled to the second end of the fourth fuse; and a fourth flip flop having a clock coupled to the output of the third flip flop, a reset input coupled to the test signal node, and an output coupled to a second input of the fourth logic gate.

9. The circuit of claim 8 wherein the third and fourth flip flops are T flip flops.

10. The circuit of claim 8 wherein the third and fourth logic gates are OR gates.

* * * * *